US010564241B2

(12) United States Patent
Snyder et al.

(10) Patent No.: US 10,564,241 B2
(45) Date of Patent: Feb. 18, 2020

(54) STEERING RESONANCE ALONG A TRAJECTORY

(71) Applicant: Regents of the University of Minnesota, Minneapolis, MN (US)

(72) Inventors: Angela Lynn Styczynski Snyder, Minneapolis, MN (US); Curtis A. Corum, Shoreview, MN (US); Djaudat S. Idiyatullin, New Brighton, MN (US); Steen Moeller, Golden Valley, MN (US); Michael G. Garwood, Medina, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 1497 days.

(21) Appl. No.: 13/743,902

(22) Filed: Jan. 17, 2013

(65) Prior Publication Data

US 2013/0271133 A1  Oct. 17, 2013

Related U.S. Application Data

(60) Provisional application No. 61/587,333, filed on Jan. 17, 2012.

(51) Int. Cl.
*G01R 33/56* (2006.01)
(52) U.S. Cl.
CPC .................................. *G01R 33/56* (2013.01)
(58) Field of Classification Search
CPC .. G01R 33/32; G01R 33/445; G01R 33/4816; G01R 33/4824; G01R 33/4833; G01R 33/56; G01R 33/5659

USPC ................................................... 324/300–322
See application file for complete search history.

(56) References Cited

U.S. PATENT DOCUMENTS

| | | | | |
|---|---|---|---|---|
| 7,336,145 B1 * | 2/2008 | Zelinski | ............ | G01R 33/5611 324/307 |
| 7,777,484 B2 * | 8/2010 | Garwood | ............... | G01N 24/10 324/307 |
| 8,519,707 B2 * | 8/2013 | Corum | ............... | G01R 33/4641 324/307 |
| 2008/0063247 A1 * | 3/2008 | Griswold | ............. | G01R 33/561 382/128 |
| 2008/0272782 A1 * | 11/2008 | Lin | ....................... | G01R 33/482 324/312 |
| 2008/0292163 A1 * | 11/2008 | DiBella | ................. | G01R 33/561 382/131 |
| 2009/0085563 A1 * | 4/2009 | Bito | .................... | G01R 33/4833 324/307 |

(Continued)

OTHER PUBLICATIONS

Wu, X., et al. "A flexible design algorithm for single-shot 2d circular/elliptical OVS rf pulses." Proceedings of the 17th Annual Meeting of ISMRM, Honolulu, Hawaii, USA. 2009. APA.*

(Continued)

*Primary Examiner* — Rishi R Patel
(74) *Attorney, Agent, or Firm* — Quarles & Brady LLP

(57) ABSTRACT

A method for generating a magnetic resonance image includes applying a radio frequency (RF) pulse to a specimen. The method includes modulating a spatially varying magnetic field to impart an angular velocity to a trajectory of a region of resonance relative to the specimen. The method includes acquiring data corresponding to the region of resonance and reconstructing a representation of the specimen based on the data.

30 Claims, 11 Drawing Sheets

(56) References Cited

U.S. PATENT DOCUMENTS

| | | | |
|---|---|---|---|
| 2010/0104157 A1* | 4/2010 | Doyle | G01R 33/4826 |
| | | | 382/131 |
| 2011/0156704 A1* | 6/2011 | Boernert | G01R 33/3415 |
| | | | 324/309 |
| 2012/0194184 A1* | 8/2012 | Grissom | G01R 33/4836 |
| | | | 324/309 |
| 2012/0223706 A1* | 9/2012 | Hetherington | G01R 33/34007 |
| | | | 324/307 |

OTHER PUBLICATIONS

Deligiannidis, Leonidas, and Hamid R. Arabnia. "Security surveillance applications utilizing parallel video-processing techniques in the spatial domain." Emerging Trends in Image Processing, Computer Vision and Pattern Recognition. Morgan Kaufmann, 2015. 117-130. (Year: 2015).*

* cited by examiner

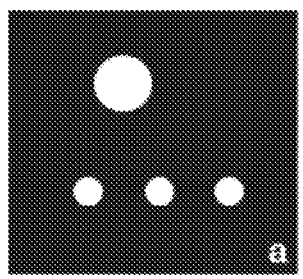 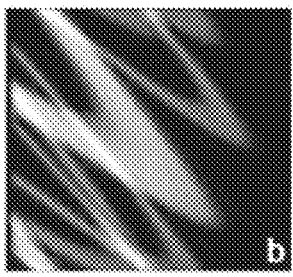 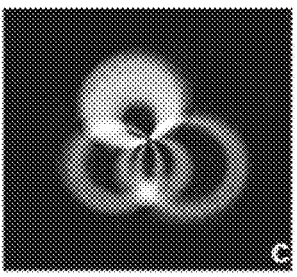 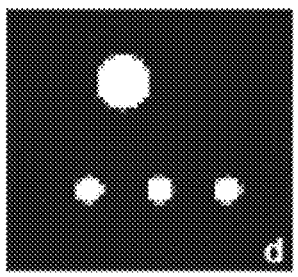
*FIG. 6A*   *FIG. 6B*   *FIG. 6C*   *FIG. 6D*
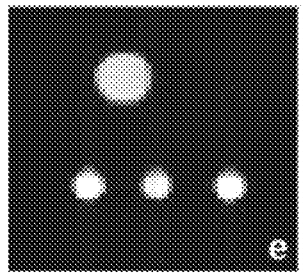 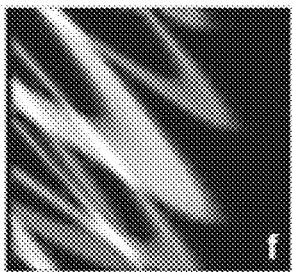 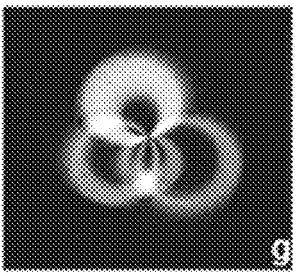 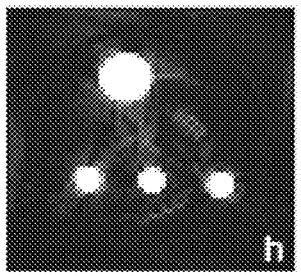
*FIG. 6E*   *FIG. 6F*   *FIG. 6G*   *FIG. 6H*
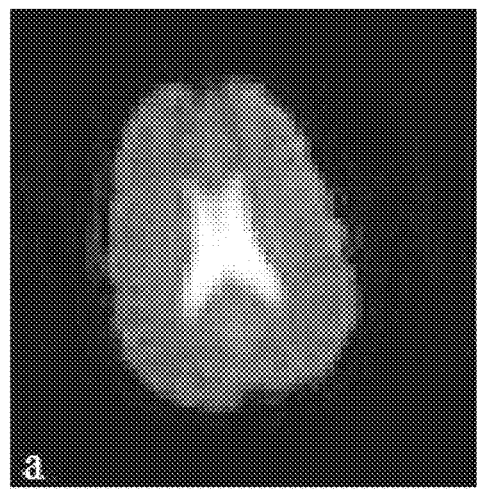 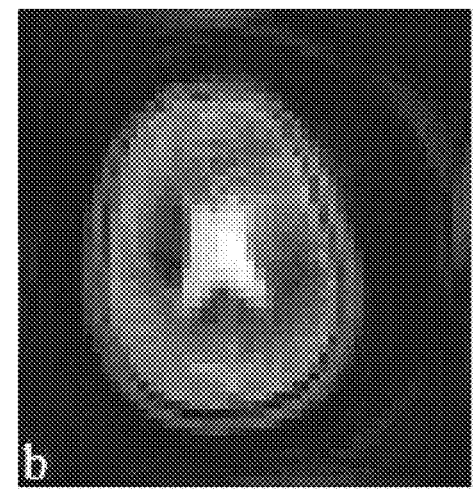
*FIG. 7A*   *FIG. 7B*

STEERING RESONANCE ALONG A TRAJECTORY

CLAIM OF PRIORITY

This patent application claims the benefit of priority, under 35 U.S.C. Section 119(e), to U.S. Provisional Patent Application Ser. No. 61/587,333, entitled "STEERING RESONANCE ALONG A TRAJECTORY," filed on Jan. 17, 2012, which is hereby incorporated by reference herein in its entirety.

STATEMENT REGARDING FEDERALLY SPONSORED RESEARCH OR DEVELOPMENT

This invention was made with Government support under P41 RR008079, S10 RR023730, and S10 RR027290 awarded by the National Institutes of Health. The Government has certain rights in the invention.

BACKGROUND

Magnetic resonance imaging entails generating an image of a region of interest based on spins excited by a pulse sequence and under the influence of a biasing magnetic field. Increasing the magnetic field strength holds promise of providing improved imaging and faster results.

However, the interest in imaging using higher magnet fields is frustrated by various factors, including limitations on specific absorption ratio (SAR) and current technology for ensuring a homogeneous field within the magnet bore.

OVERVIEW

An example of the present subject matter includes a pulse sequence including a frequency and amplitude modulated RF pulse applied in the presence of modulated gradients to excite signal that can be collected and resolved in an entirely spatiotemporal domain. One example allows image reconstruction without conducting a Fourier transform.

An example of the present subject matter can be used for magnetic resonance imaging (MRI), with specific advantages for imaging using inhomogeneous $B_1$ and $B_0$ fields. This is useful for imaging using higher magnetic field strengths, which inherently face more substantial challenges in producing homogeneous static ($B_0$) and transmit fields ($B_1$). This is also advantageous for producing more affordable (and possibly portable) scanners because generating a homogeneous $B_0$ is a substantial barrier to producing a low-cost system.

Fourier-free image reconstruction is particularly unusual in the world of magnetic resonance. According to one example, the present subject matter only excites one region of resonance moving in time, so that it is spatially independent in both transmit and receive, which other spatiotemporal sequences have not been able to demonstrate.

The spatiotemporal dependence of the present subject matter is particularly valuable when dealing with problems that are inherently spatial in nature such as $B_1$ and $B_0$ inhomogeneities, for which the present subject matter can compensate both during the actual sequence, transmit and receive, as well as in post-processing by using an inverse problem reconstruction method. An example of the present subject matter entails steering a region of resonance. One example of the present subject matter can be viewed as spatiotemporal encoding with incremental refocusing along a trajectory.

Unlike other methods, one example of the present subject matter does not require excitation of the entire imaging space in a grid-like manner. One example is entirely spatially independent and thus allows for correction of complex multi-dimensional $B_1$ and $B_0$ inhomogeneities.

One example entails excitation having a gapped sequence and allows for nearly simultaneous transmit and receive. The excitation can be implemented using a gapped frequency and amplitude modulated RF pulse applied in the presence of modulated gradients to alternately excite and acquire for nearly simultaneous transmit and to receive in an entirely spatiotemporal domain with reconstruction without a Fourier transform. This configuration combines the advantages of spatiotemporal encoding with the advantages of being able to detect extremely short $T_2$ signals.

Certain protocols allow capture of very short $T_2$ signals and are thus well suited for imaging bone and similar dense material. Both MRI and CT have substantial difficulty imaging near metal implants due to susceptibility or starburst artifacts. One example of the present subject matter can be implemented with a nearly simultaneous transmit and receive can compensate for $B_1$ and $B_0$ inhomogeneities and image tissue having very short $T_2$. One configuration is particularly suited for high field imaging. One example can compensate for field inhomogeneity and is largely immune to the problems arising from the shortening of $T_2$ that correlates to field strength. One example can be used for imaging bone in the vicinity of metal implants as the sensitivity to short $T_2$ signals makes bone visible and susceptibility artifacts less severe and the ability to spatially compensate for these artifacts may make it feasible to image near metal implants.

One example enables imaging by moving an isolated resonance region in the spatial domain, acquiring data in a time dependent manner, and reconstructing an image without the use of a Fourier transform. The region of resonance can be described as rotationally isolated.

The trajectories of the region of resonance can be selected to follow a variety of paths, including a curved path, a spiral path, or a circular path. Trajectories can be nested or interleaved between spirals or follow a path of concentric or offset and rotated circles.

Data acquisition can be interleaved with excitation or simultaneous (or near simultaneous) with excitation. In addition, acquisition can occur during the excitation, or acquisition can occur after excitation. For example, a swept frequency sequence can be used and acquisition can occur in the time-wise gaps in the pulse, or acquisition can occur during the gaps and after the excitation, or acquisition can occur after the excitation.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 6A-6H illustrates image reconstruction, according to various examples.

FIGS. 7A and 7B illustrate sample images, according to various examples.

DETAILED DESCRIPTION

Part I

Figure 1A:
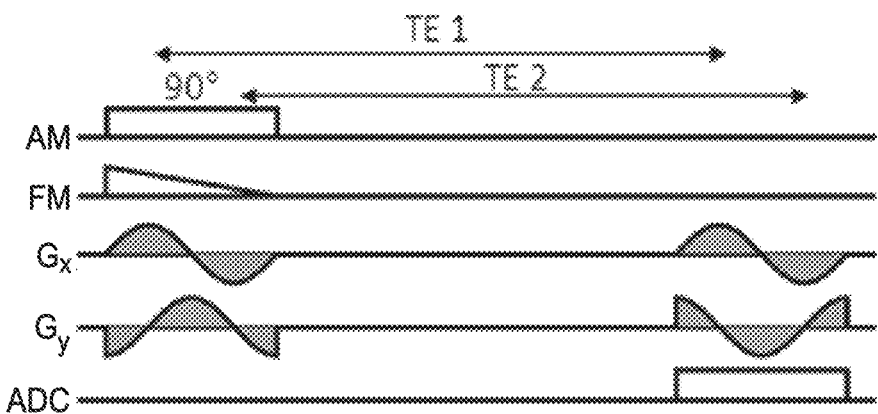
FIGS. 1A, 1B, and 1C illustrate pulse sequences, according to various examples.

A frequency-swept radiofrequency pulse and modulated gradients can be used to move a resonant region through space to generate sequential excitation and echo formation with time-dependence, which allows image production without use of the classic Fourier transform. Simulations and experiments can be used to implement a sequence and demonstrate an inverse problem reconstruction method.

By moving, or steering, the resonant region, each such region in space can be treated independently. Such spatial independence can allow compensating for inhomogeneous static ($B_0$) and radiofrequency ($B_1$) fields, which can be of interest for higher field strengths and, for all field strengths, of interest for reducing the cost of scanners by reducing constraints on homogeneity.

Part II

Spatiotemporally-encoded MRI can be advantageous over traditional frequency and phase encoding in certain applications. An example of the present subject matter concerns entirely spatiotemporal image acquisition. One example of the present subject matter entails steering resonance through space in a temporally dependent manner Time encoding can be used to produce an image by moving a resonant region along a trajectory in space such that the excitation is itself spatially selective. Each region can then be refocused sequentially during acquisition, retaining the unique spatiotemporal dependence that was established in the excitation. Accordingly, no explicit Fourier transform (FT) is needed for reconstruction. The spatial localization of the excitation allows for highly tailored traversals of space and provides inherent freedom for facilitating independent treatment of each resonance region, rather than each grid dimension. This allows finely tailored compensating for multi-dimensional $B_1$ and $B_0$ inhomogeneities.

The resonance region may not be sufficiently compact (i.e. not a delta function), and thus, reconstruction by geometrically-driven coordinate transformation may be problematic. However, an inverse problem solution can be used to reconstruct the signal into an image. One example entails working entirely in the spatiotemporal domain and thus allows direct treatment of inherently spatial problems. This spatial isolation is particularly unusual in MR imaging and thus opens opportunities for applications that may not otherwise be considered with k-space based MR techniques.

Part III

In one example, spatiotemporal encoding is provided by applying a gradient along a selected encoding direction and concurrently applying a RF pulse with a chirped frequency sweep. As the pulse frequency is swept, the isochromats are rotated into the transverse plane sequentially. The phase of each isochromat is a combination of the phase acquired from the RF excitation and the phase accumulated while freely precessing. By applying a gradient in the opposite direction, the phase of each isochromat is unwound sequentially, and thus, locally refocused. At any given time, the isochromats that are in phase contribute the majority of the signal.

Consider the spatial MR technique referred to as outer-volume-suppression (OVS). For OVS, each band of suppression is achieved by exciting and then spoiling unwanted magnetization using gradients and applying a pulse selecting a set of gradients and a RF frequency offset to excite and then suppress a region of signal that is outside the region of interest. In a typical OVS method, a series of bands are selected surrounding the object of interest to suppress undesirable signal. In the limit of infinite suppression bands, or equivalently, infinitely small angular increments, OVS produces a curved, continuous suppression region.

In this case, instead of using constant gradients for each band, sine modulated gradients and cosine modulated gradients are employed to suppress a continuous ring of signal outside the region of interest. With a constant offset frequency, the ring has a constant radius. However, if a frequency sweep is used, from the maximum offset to zero, then the continuously decreasing radius in the presence of sine and cosine gradients forms a spiral. An example of the present subject matter is configured to preserve signal along a spiral of excitation and not suppress it as with continuously varying OVS.

A variety of trajectories can be configured according to the present subject matter. In one example, an Archimedean spiral with constant radial velocity over $2\pi$ radians is presented both for the simplicity of the geometric description and for the constant angular and radial velocities.

Figure 1B:
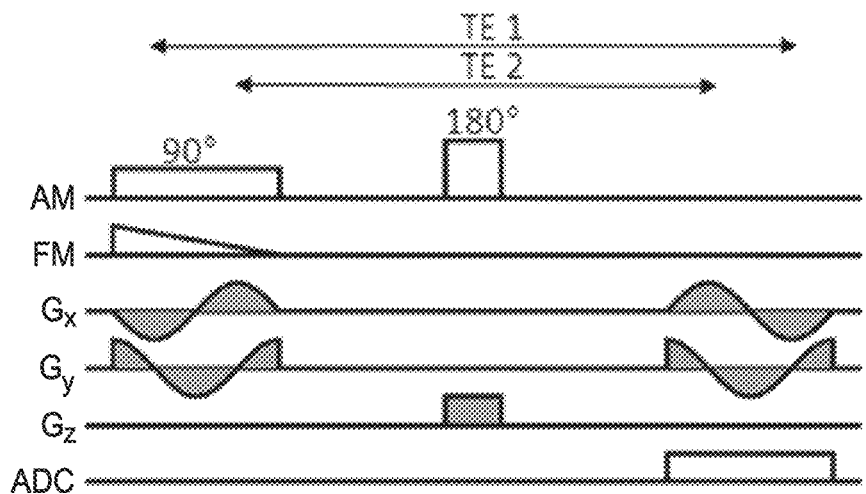
Figure 1C:
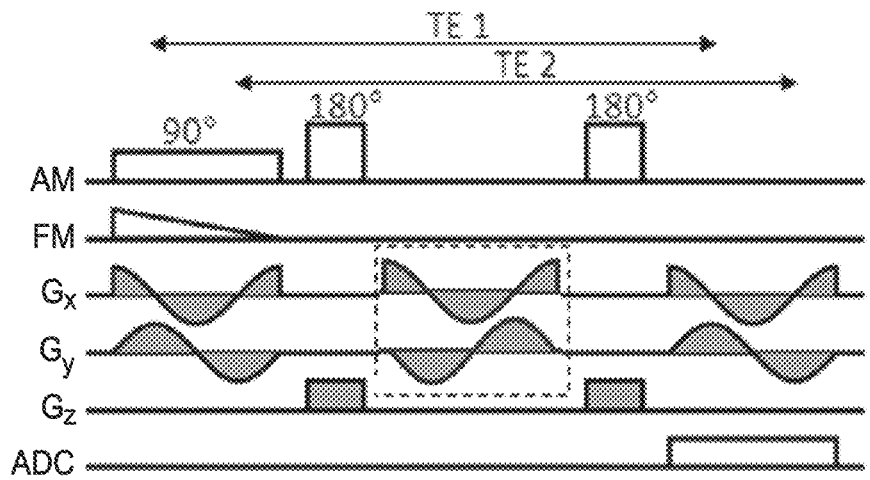

FIG. 1 illustrates examples of the present subject matter, including, at FIG. 1A, gradient echo (GRE), at FIG. 1B, spin echo (SE), and at FIG. 1C, double spin echo. A chirp pulse can be used for excitation in the presence of a modulated gradient. Signal is refocused and then acquired. Both GRE and double SE exhibit constant TE across the image using examples of the present subject matter. The gradient shapes within the dashed box (FIG. 1C) are optional because being sinusoidal, they balance themselves.

In the Archimedean spiral trajectory, a frequency sweep can include a chirp pulse terminating at zero offset and constant $B_1$ amplitude can be applied concurrently with sinusoidal gradients on two axes offset by one-quarter cycle. The resultant trajectory is a spiral from the maximum radial distance to the center with constant angular and radial velocity components. The frequency may similarly be swept from zero offset to the maximum, thus creating a spiral starting at the center and proceeding outward. With a chirp pulse (constant $B_1$ amplitude) the flip angle $\alpha$ is proportional to $(b_w/T_p)^{1/2}$ where $b_w$ is the frequency-swept bandwidth and $T_p$ is the duration of the excitation pulse. In the case of a chirp pulse, the frequency is swept at a constant rate, which implies that, as the time-dependent offset frequency $\omega(t)$ is changed linearly with time, at any point in time during the excitation the rate of change of the offset frequency will be $b_w/T_p$. Therefore, $\alpha$ is proportional to $(d(\Delta\omega(t))/dt)^{1/2}$, which is constant, and thus the flip angle along the trajectory is constant.

The modulated gradients may initially appear to complicate many of the calculations shared by other time-encoded imaging, especially if attempting to consider each Cartesian axis separately. Polar coordinates can be used as follows:

$$\theta = \arctan\left(\frac{G_y(t)^{-1}}{G_x(t)^{-1}}\right), \quad (1)$$

and $$r(t) = \sqrt{(G_x(t)^{-1}\Delta\omega(t))^2 + (G_y(t)^{-1}\Delta\omega(t))^2}, \quad (2)$$

where $G_x$ and $G_y$ are the x and y gradients respectively and $r(t)$ is the distance from the center to a given point along the trajectory. For the Archimedean spiral form according to one example, let $\psi$ be the desired degree of rotation along the spiral so that $G_x=A_x\cos(\psi)$ and $G_y=A_y\sin(\psi)$. Assuming the gradients are chosen so that the maximum amplitudes of the x and y gradients are equivalent, $A_x=A_y=A_{xy}$. Equations 1 and 2 simplify to $$\theta=\psi(t), \quad (3)$$

and $$r=\Delta\omega(t)/A_{xy}. \quad (4)$$

In this case, $\theta$ depends only on the direction of the gradients, while r arises from the instantaneous value of the frequency sweep scaled by the inverse gradient amplitude. Defining the range of $\psi$ as 0 to $2\pi$, the angular term can be rewritten:

$$\theta = \frac{2\pi t}{T_p}. \quad (5)$$

For an Archimedean spiral trajectory with constant angular and radial velocities and a chirp pulse:

$$\frac{d^2\theta}{dt^2} = \frac{d^2 r}{dt^2} = \frac{d^2\Delta\omega}{dt^2} = 0, \quad (6)$$

which means that $\theta \propto r \propto \omega \propto t$. This relationship allows selection of an independent variable from which the function can be evaluated.

Part IV—Imaging

In the case of a GRE version, such as that shown in FIG. 1A, repeating the sinusoidal gradients during acquisition allows for the sequential encoding of signal, not in the traditional form of a series of echoes, but rather as a superposition of signals arising from the spatially and temporally continuous nature of the frequency-swept excitation.

Consider the spin-echo versions of one example, as shown in FIG. 1B and FIG. 1C. One or more 180° pulses can be applied to reverse the phase evolution, and at those times, slice selective gradients can be applied. Replaying the excitation gradient shapes in reverse will result in the sequential phase refocusing along the trajectory in the opposite direction of the excitation. As in the GRE form (FIG. 1A), the resultant signal over time is not a classic echo, but rather a superposition of "local" echoes. The signal can be acquired during the application of this reversed set of gradient shapes in the case of one 180° pulse (FIG. 1C), or again inverted and acquired while applying a set of gradients matching the first in the double echo case. In a single echo (SE) implementation, spins excited first will be refocused last, and spins excited later will be refocused earlier, and thus, the TE will vary along the trajectory. The double echo form remedies this condition with the second 180° pulse. A spin excited early will be refocused late after the first 180° pulse, therefore it will be refocused early after the second 180° pulse such that it will yield most of its signal early in the acquisition. Similarly, a spin excited late will refocus late. Ergo, TE will be constant across the image.

Repeating the spiral trajectory at different initial angles of the gradients provides coverage of a two-dimensional (2D) area. This gives rise to an additional term describing the degree of initial rotation $\theta_i$. As such, equation (5) becomes:

$$\theta=2\pi T^{-1}t+\theta_i. \quad (7)$$

Sequential excitation and subsequent echo formation along the trajectory produces a time-dependent and space-dependent refocusing. The dephasing of signal following excitation or refocusing is sufficiently rapid such that the maximum signal at a given time point can be attributed to the excited or refocused region, which can be viewed as a resonant region moving through space. If the profile of the resonant region is sufficiently compact, essentially equivalent to a 2D delta function, then image reconstruction can be done by geometric coordinate transformation and Jacobian weighting.

The delta function assumption may not hold and thus the coordinate transformation reconstruction may not be available.

Next, consider the characteristics of the resonance region as follows.

The profile of the region of resonance is governed by two types of frequency sweep which generates two degrees of signal localization. As with other time-encoding sequences, the RF frequency sweep provides one degree of localization. The other degree of localization can be determined by the $B_0$ frequency sweep imparted by the gradients. Slice selection can be applied in the third dimension.

Figure 2A:
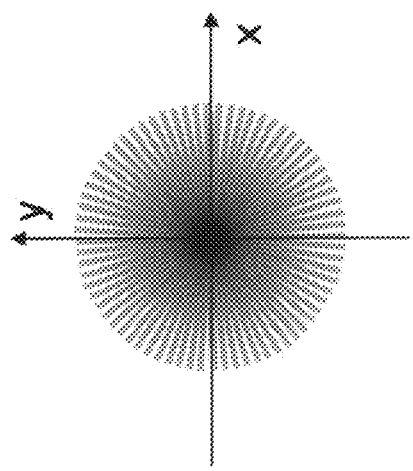
FIGS. 2A, 2B, and 2C illustrate rotating slices, according to various examples.

First consider the RF frequency sweep. A RF pulse of finite bandwidth with a constant frequency offset applied in the presence of a constant gradient will generate a planar slice of excitation having a direction perpendicular to the gradient vector, G, as depicted in FIG. 2A. A frequency-modulated pulse excites not only a slice but rather a continuous superposition of slices, each having a different excitation time and corresponding phase, which can be viewed as a translating plane, or a wavefront, perpendicular to the gradient direction. The frequency sweep rate, $\Delta\omega(t)$, and the gradient amplitude, $A_{xy}$, determine the velocity of the wavefront.

Figure 2B:
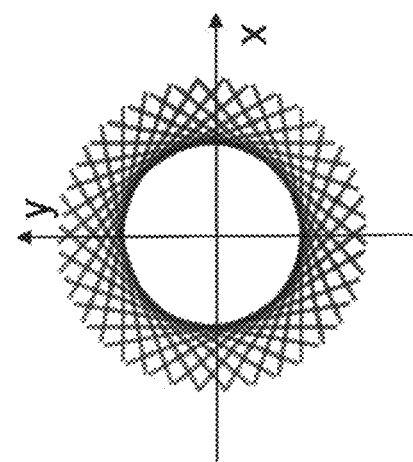
Figure 2C:
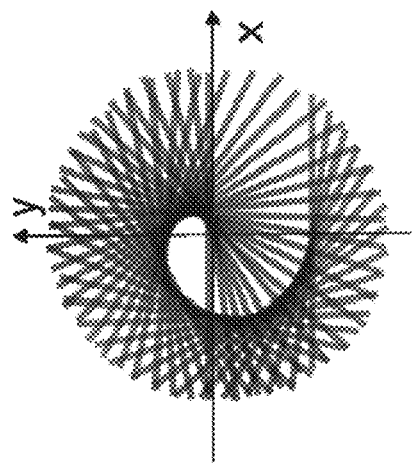

FIGS. 2A, 2B, and 2C illustrate rotating slices. A rotated set of slices with no RF frequency offset, as in FIG. 2A, produces greater excitation at the center than in the periphery. If a constant frequency offset is added, then excitation akin to OVS bands is produced, as in FIG. 2B. As shown, maximum excitation can be seen along the circle whose radius is the frequency offset. If the offset frequency is stepped with each gradient rotation, then the maximum excitation is generated along a spiral trajectory, as in FIG. 2C. Excitation, such as that shown in FIGS. 2A-2C can be applied continuously using sinusoidal gradients rather than repeating rotated slices.

Consider a singular slice perpendicular to the wavefront. This simplifies to a two-dimensional (2D) situation wherein the excitation wavefront is now a band perpendicular to the instantaneous gradient vector. This is equivalent to the time encoding dimension of other spatiotemporal sequences. In polar coordinates, this can be viewed as a sweeping r while leaving θ constant.

Next, consider a band (or a plane with perpendicular slice selection) of excitation with zero offset and no frequency sweep. Changing the gradient direction changes the orientation of the band (FIG. 2A). Gradients rotated by a particular amount will cause the excitation band to rotate accordingly. In this rotating case, the spins at the center will experience a great deal of RF energy while more distal spins, which will fall within the band only for a limited period of time, will experience less RF energy. With a constant non-zero offset, this is continuously varying outer-volume suppression before spoiling (FIG. 2B). In polar coordinates, this can be viewed as a sweeping θ while leaving r constant.

Next, consider a band which is both translating and rotating (FIG. 2C). This can be viewed as exciting a series of sequential individual bands, rotated as with outer-volume suppression, along with a RF frequency sweep from the largest offset frequency to zero. The whole band will be subject to the same radial velocity; however, the angular velocity will be much less at the centroid (the point along the band that is on the spiral trajectory and shown in FIG. 3B as point A) and will be greater at more distal parts of the band by an amount proportional to the distance (L) from the centroid (see FIG. 3B point B). The centroid experiences the least rotational velocity because it is closest to the axis of rotation. Therefore, the points along the trajectory of the centroid will experience the most RF energy, and points swept by more distal portions of the band of resonance will experience less RF energy.

Figure 3A:
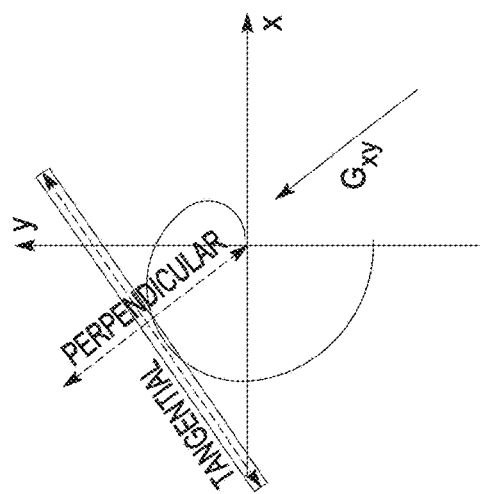
FIGS. 3A, 3B, and 3C illustrate regions of excitation, according to various examples.
Figure 3B:
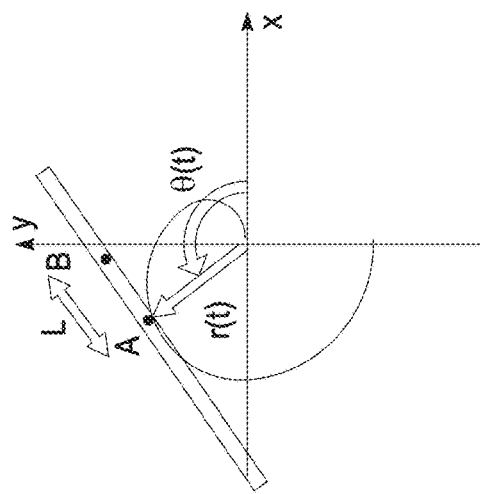
Figure 3C:
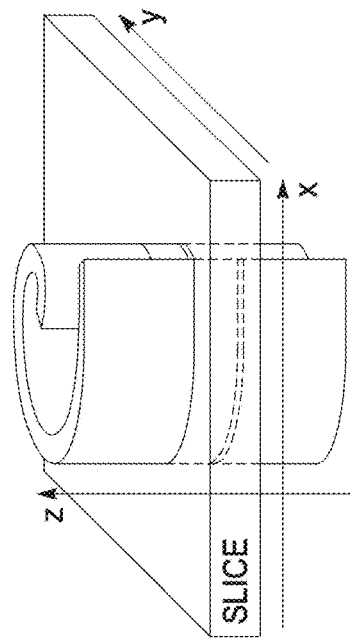

The region of excitation can be described in terms of the perpendicular profile, the tangential profile, and the slice-select profile. FIG. 3A shows a slice excited using a particular frequency offset. FIG. 3B illustrates the centroid (A), having a position which can be described by the angle of rotation (θ) and distance from the center of the field of view (r), and a second point (B) within the band of excitation and located a distance (L) from the centroid. The region of maximum signal arising from bands of excitation rotated about the z-axis will be a scroll, as shown in FIG. 3C. Slice selection can be used for signal localization perpendicular to the scroll.

The profile of the excitation in the direction perpendicular to the trajectory is akin to the determination of the resolution along the time-encoded dimension in other spatiotemporal imaging methods. Conversion to polar-coordinate space shows that one example of the present subject matter can be viewed as a frequency sweep with a constant gradient, revealing that the perpendicular profile resembles that of a frequency swept pulse, dependent primarily on the sweep rate.

Figure 4:
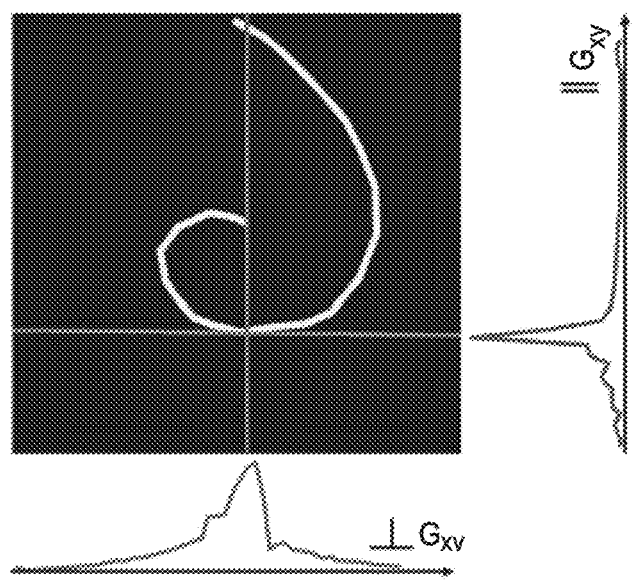
FIG. 4 illustrates profiles associated with moving regions of resonance, according to one example.

FIG. 4 illustrates a moving region of resonance, having a tangential profile and a perpendicular profile. The $M_{xy}$ profiles are as indicated: bottom profile along the line tangential to the trajectory and right profile perpendicular to the trajectory.

The profile tangential to the trajectory is dominated by the rotational velocity. The excitation at the centroid is determined only by the velocity along the trajectory, while every other point in the plane tangent to r will be further from the axis of rotation and thus have a greater velocity. The degree of excitation of any point in the tangential profile is inversely related to its distance from the centroid. As the centroid of excitation travels along the defined trajectory, those isochromats falling within the band at a point nearer the centroid will have lower instantaneous velocity and experience more RF energy and subsequently contribute proportionally more signal during acquisition than those isochromats in the excitation band further from the centroid. The profile along the tangential line of excitation calculated from Bloch simulation is shown in FIG. 4 along the horizontal axis (in red).

Slice selection can be used to obtain a third dimension of isolation. One example of the present subject matter can provide a three-dimensional sequence, rather than slice-selective, by rotating a plane spherically rather than circularly (applying gradient modulated rotation on all three axes). An additional dimension of rotational selection can eliminate the need for slice-selection.

Figures 5A, 5B:
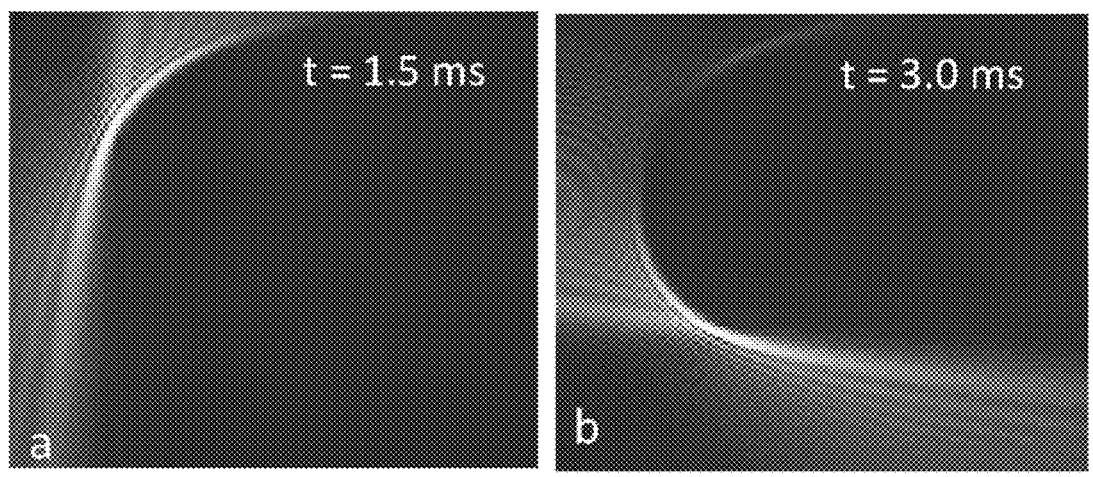
FIGS. 5A-5D illustrate profiles associated with moving regions of resonance, according to various examples.
Figures 5C, 5D:
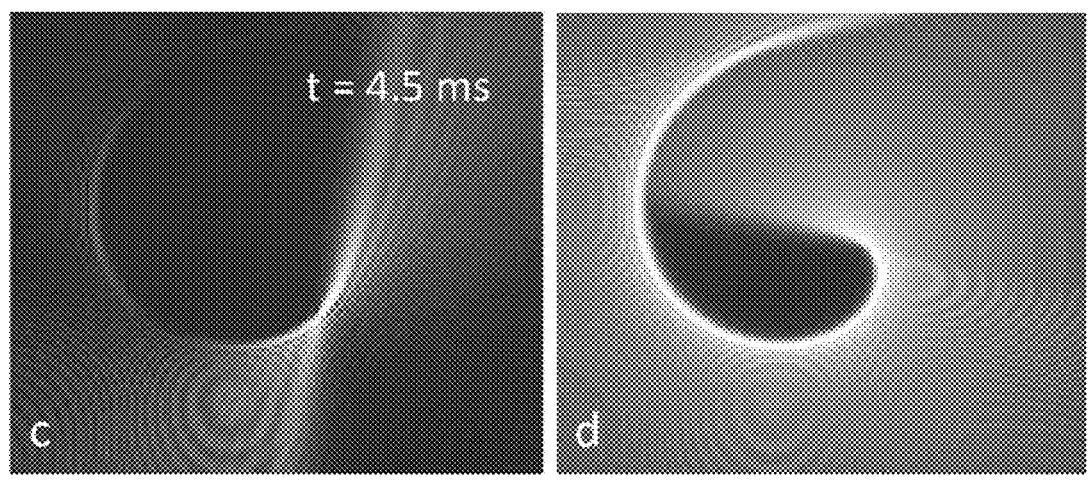

A Bloch-based simulation of one example of the present subject matter can be used to show the excitation profile in 2D. FIGS. 5A-5C show a simulated magnitude of the transverse magnetization at three discrete time points during excitation, demonstrating that the greatest excitation is at the centroid.

FIG. 5D shows the maximum magnitude of the transverse magnetization of each point from the duration of the excitation. In the simulations, the initial longitudinal magnetization was set to 1. The excitation is not isolated to 2D delta functions moving along the desired trajectory, but rather a moving region of resonance. Excitation is at a maximum along the trajectory.

The figures also illustrate that the excitation is not limited to a single point but rather a region of resonance. While the maximum signal is well localized to the expected trajectory, because the acquired signal is a summation over the whole spatial domain, the contributions from other regions, while proportionally much weaker than the signal from the trajectory of interest, constitute a substantial part of the total signal, indicating that a geometric assignment (coordinate transformation) of the signal is only an approximation and another method can be considered for image reconstruction.

Part V—Simulation Methods

Simulations can be performed with a program based on the Bloch equations using a combination of Matlab and C. Results from these simulations can be used to show the sequential excitation along a trajectory in the rapid-passage, linear region. FIGS. 5A-5D represent using a chirp pulse and sinusoidal gradients to produce an Archimedean spiral with parameters $T_p$=20 ms, $b_w$=27.5 kHz, and field of view of 129×129 pixels. FIG. 5D illustrates a narrow ridge with relatively consistent amplitude.

Simulations can also be used to predict the behavior of the sequence in acquisition. In one example, to replicate the experimental acquisition the signal is summed over the whole space for the duration of the acquisition. As with certain experiments, data simulated for each of the rotated spirals can be combined to form an image.

FIGS. 6A-6H illustrate reconstruction of data using an inverse problem solution and reconstruction of data using a geometric coordinate transformation. The top row of images in the figure (FIGS. 6A-6D) illustrate a simulated object and the bottom row of images (FIGS. 6E-6H) illustrate a real object.

The simulated 2D object shown in FIG. 6A includes three small circles and one large circle, all with uniform signal intensity. FIG. 6B shows the data that can be acquired from simulation and displayed such that along the horizontal axis is the time-dependent acquisition. Recall that $\theta \propto r \propto \omega \propto t$. The vertical axis is a series of separate spirals ordered according to initial rotation about the through-plane axis, or $\theta_i$, together forming a spirogram. The magnitude of the resulting spirogram acquired with an example of the present subject matter is shown in FIG. 6B and FIG. 6F. The horizontal axis represents time and the vertical axis represents an initial gradient angle.

FIG. 6C and FIG. 6G depict reconstruction using a geometric coordinate transformation.

Reconstruction using an inverse problem solution is shown in FIG. 6D (simulated image) and FIG. 6H (experimental image).

FIGS. 6C and 6D represent reconstructed data using geometric coordinate transformation and inverse problem methods respectively, which shows the approximate nature of assuming the resonant region is close to a 2D delta function.

The data for FIGS. 6A-6H can be generated with a double echo version of one example of the present subject matter using an excitation bandwidth ($b_w$) equal to 40 kHz, acquisition bandwidth ($s_w$) equal to 80 kHz, and the number of acquired points ($N_p$) chosen such that $N_p/s_w=6.0$ ms. Additional simulation parameters are $T_p=6.0$ ms, TE=21 ms, and since each spiral can be simulated separately with no memory of the previous spirals, the pulse repetition time (TR) can be considered infinite. The trajectory is an Archimedean spiral traversed with constant angular velocity.

In addition to validating the theory and experimental results, simulation data can also be used to define the transfer function for the inverse problem solution.

Part VI—Experimental Methods

A 4 T magnet having a 90 cm bore diameter can be used with a clinical gradient system and an imaging spectrometer console. Experimental results can be collected with a double-echo sequence using 180° pulses from the hyperbolic secant family. The number of complex points along the trajectory ($N_p$) can be 512, and the number of rotated spirals (M) collected can be 128, following an Archimedean spiral trajectory with constant angular velocity. The pulse powers can be calibrated by arraying the pulse width to determine the power to achieve a 180° flip angle.

For the phantom experiments, as in FIG. 6A-6H, the RF coil employed in both transmit and receive can be a quadrature surface coil having two loops. One 50 mL test tube and three 10 mL test tubes can be positioned upright in the coil, and the images can be collected in the coronal plane. The phantom experiments can be performed with $b_w=40$ kHz, $s_w=80$ kHz, $T_p=N_p/s_w=6.4$ ms, TE=21 ms, and TR=4 s. The field of view can have a diameter of 20 cm.

Human experiments, such as shown in FIG. 7A-7B, can utilize a 16-element transverse electromagnetic head coil. Using one example of the present subject matter, images can be collected in the transverse plane with $b_w=40$ kHz, $s_w=80$ kHz, $T_p=N_p/s_w=6.4$ ms, TE=21 ms, and TR=4 s. The standard images can be GRE images with $T_p=N_p/s_w=6.4$ ms, TE=21 ms, and TR=4 s. The field of view can have a diameter of 30 cm.

FIGS. 7A and 7B illustrate a comparison of one example of the present subject matter with a traditional imaging method. FIG. 7B illustrates an experimental image acquired at 4 T with a double echo sequence and reconstructed with an inverse problem solution. FIG. 7A illustrates a standard GRE image of the object collected at a comparable resolution.

Part VII—Reconstruction

In one example, an inverse problem solution can be used for reconstruction. Because the signal is temporally localized in space by translational and rotational motion, the geometric coordinate transformation (that is, assigning signal along the trajectory according to the known spatial-temporal relationship) which has been used along one dimension with previous time-encoding sequences may not be a good approximation, as demonstrated in both simulation and experiment (FIG. 6C and FIG. 6G). A numerical inversion is a general encoding method for reconstructing the desired image (unknown) from the time-dependent magnetization evolution (known).

The inverse mapping problem can be used with other imaging modalities, such as electrocardiography. Inverse mapping can be used in MRI with standard encoding for spectral localization and spectroscopic imaging as well as for addressing Gibb's ringing. Similar methods can be applied in MRI along one dimension for enhanced resolution.

Figure 8A:
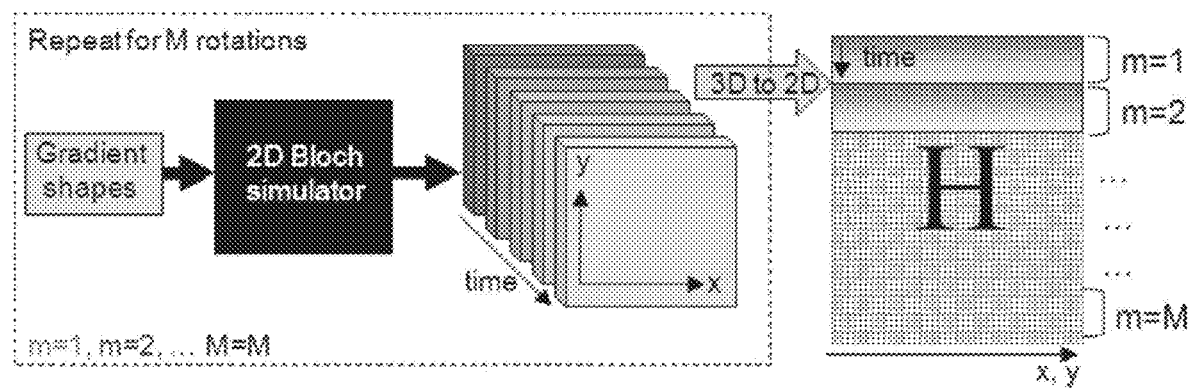
FIGS. 8A, 8B, and 8C illustrate schematic diagrams for reconstruction, according to various examples.
Figure 8B:
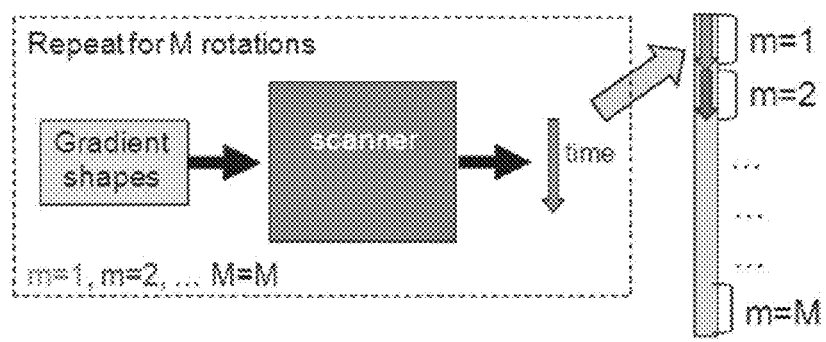
Figure 8C:
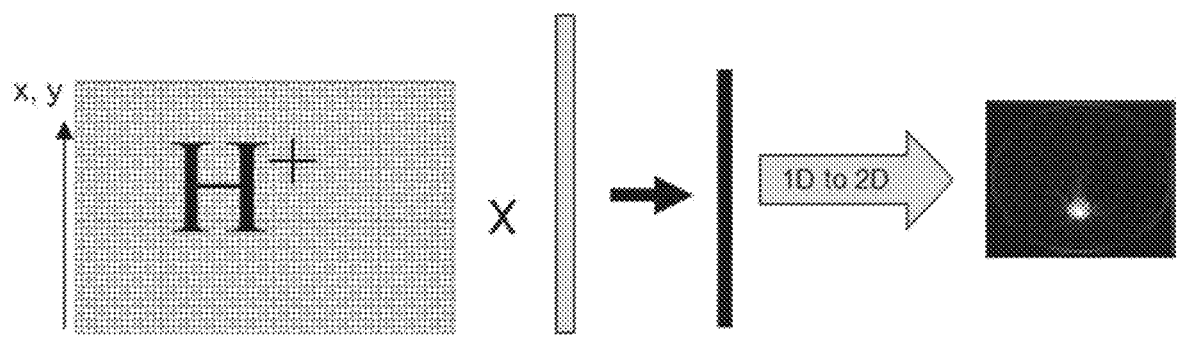

Generating an image is depicted graphically in FIGS. 8A, 8B, and 8C.

The figures illustrate a schematic diagram of the inverse problem reconstruction. The forward problem is shown in FIG. 8A. A transfer matrix is generated using a Bloch simulator with different gradient shapes for each rotated spiral. The rotations and time are combined and the spatial coordinates (x and y) are combined to generate a two-dimensional matrix. The experimental acquisition is shown in FIG. 8B. Signal acquired from the scanner is combined into one vector. The inverse problem reconstruction is shown in FIG. 8C. The pseudoinverse of the transfer function can be used to generate spatial values from the time and rotation data.

In FIG. 8, H is the transfer matrix and $H^+$ is the pseudoinverse of that matrix. Note that for one example of the present subject matter, reconstruction involves four-dimensions: x, y, time, and rotation. Since inverting a two-dimensional matrix is a better understood and more frequently addressed problem, the four dimensions can be condensed into two dimensions, treating x and y as one dimension (range space) and time and rotation as the other dimension (domain space). A Bloch simulation program can be used to approximate the forward problem and thereby obtain an estimate of H. Then a truncated singular value decomposition solution can be computed using csvd and tsvd (Matlab package Regularization Tools). Since the known values (128 spirals of 512 points each) greatly exceed the unknown values (51×51 pixel image), the problem is heavily over-determined, and the matrix is well conditioned. This approach can produce images of the phantom both in simulation and experiment. For FIGS. 6D and 6H, H is the same. Further, the same matrix can be used for simulated or experimental data collected with the same parameters. In the example implementation illustrated, the image resolution is limited however, resolution can be greater.

If a matrix is equal to its own conjugate transpose, then it is said to be self-adjoint and is called Hermitian. The pseudoinverse, in this case a Moore-Penrose pseudoinverse, is obtained by $H^+=(H^\dagger H)^{-1}H^\dagger$ where $H^\dagger$=conjugate transpose of H.

A Bloch simulation program can be used to approximate the forward problem and thereby obtain an estimate of H. A pseudoinverse can be calculated using singular value decomposition (SVD), regularization, and other functions available in Matlab or as a part of the Matlab package Regularization Tools. The condition number of the transfer function applied to the shown images is 17.8, and as such, the matrix is well conditioned.

The condition number is a ratio of the largest to smallest singular value in the singular value decomposition of a matrix. The logarithm of the condition number is an estimate of how many digits are lost in solving a linear system with that matrix. In other words, it estimates worst-case loss of precision. A system is said to be ill-conditioned if it is too large, where "too large" means roughly the log of the condition number should be greater than the precision of the matrix entries. The singular value decomposition of a matrix (H) is given by H=UDV† where U and V are unitary matrices and D is a diagonal matrix whose elements are the singular values of H.

The pseudoinverse can be truncated or regularized by removing the smallest singular values which adds stability to the system.

The inverse problem reconstruction method entails use of an inverse of the transfer function. Consider the expression s(t)=Hf(x,y) in which s is the experimentally obtained signal, H is the transfer function generated using Bloch simulation, and f(x,y) is the object (spin density). As such, the transfer function is inverted to obtain $f(x,y)=H^{-1}s(t)$ to yield the image. In this representation, the signal can be depicted using a spirogram.

Part VIII—$B_1$ and $B_0$ Inhomogeneity Compensation

An example of the present subject matter allows for independent adjustment of the main magnetic field and RF field at each resonance region. This compensation method offers simplicity, flexibility, and robustness. For example, the flip angle can be increased only in regions with low $B_1$ without needing to apply additional RF to generate cancellation in regions with high $B_1$, and thus can produce a more homogeneous image while maintaining sufficiently low specific absorption ratio values. This allows an example of the present subject matter to be used for ultra-high magnetic field applications. The capacity to treat these problems from a spatial perspective can be beneficial. For $B_1$ inhomogeneities, compensating during the experiment allows recovering more signal. Compensating can also be conducted using post processing. The field map for post processing can be acquired using an experimental method. Combinations of the various methods, along with shimming methods, are also contemplated.

The modulation of gradients, RF amplitude, and RF frequency allows many degrees of freedom for compensation. For example, by mapping $B_1$ inhomogeneity and knowing the trajectory of the region of resonance, the RF amplitude can be modulated for compensation by increasing the amplitude proportionally when the resonance region is in an area of low $B_1$. Similarly a $B_0$ map along with known trajectory can be used for compensating main magnetic field variations. The RF frequency and the gradients can be modulated to follow a selected trajectory in the presence of the $B_0$ inhomogeneities, which can reduce distortions in the final image.

An example of the present subject matter can be used to compensate for $B_1$ inhomogeneities.

Figure 9A:
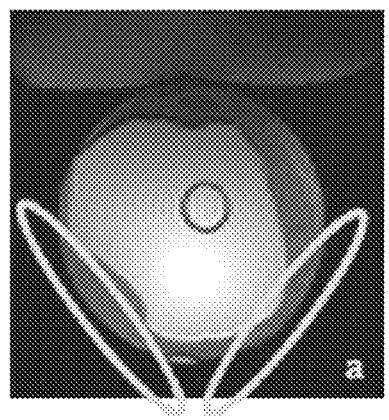
FIGS. 9A-9E illustrate field inhomogeneity compensation, according to various examples.
Figure 9B:
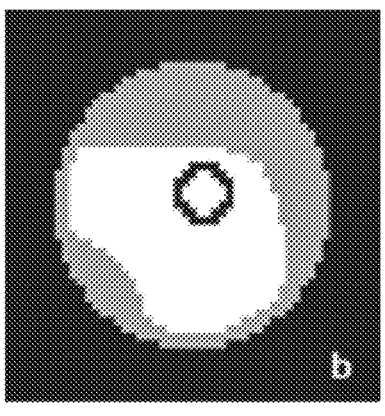
Figure 9C:
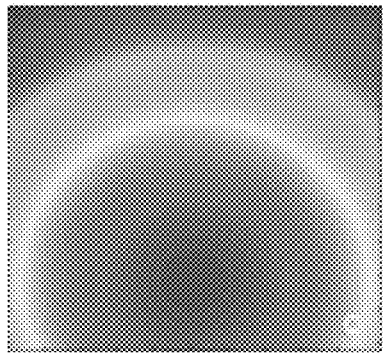
Figure 9D:
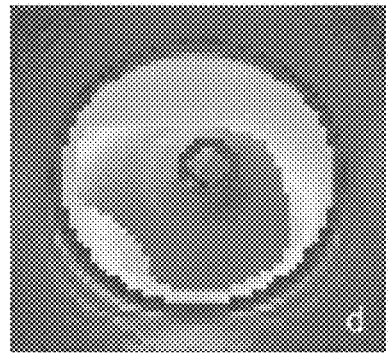
Figure 9E:
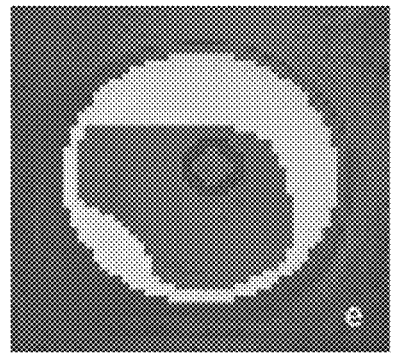

FIGS. 9A-9E illustrate simulated inhomogeneity compensation. The $B_1$ inhomogeneity is shown in FIG. 9C. The inhomogeneous image is shown in FIG. 9D. The image with inhomogeneity compensation is shown in FIG. 9E. The phantom and coil position that were imitated are shown in FIG. 9A, and the intensity profile used for simulation is shown in FIG. 9B.

A two-dimensional inhomogeneity pattern, such as that shown in FIG. 9A, can be applied during simulations of double-echo imaging. The result of applying the inhomogeneity is shown in FIG. 9B. A 51×51 resolution can be used.

Given a map of the $B_1$ inhomogeneity, new RF shapes can be generated for each of the spirals, which can be configured to compensate for the $B_1$ inhomogeneity during an actual experiment. These new RF shapes can be used to generate the image shown in FIG. 9C.

An example of the present subject matter can be used to compensate for $B_0$ inhomogeneities. In one example, an inhomogeneity map can be used. The frequency sweep and gradients can be modified to compensate accordingly, in a manner akin to the $B_1$ inhomogeneity compensation with a spatiotemporal sequence in one dimension.

An inverse problem approach can also be used to compensate for field inhomogeneities in post-processing. Post-processing can be used if compensation for either $B_1$ or $B_0$ during the experiment is undesirable or unfeasible. In this example, the method uses some prior knowledge about the RF profile or static magnetic field. In one example, the prior knowledge can be in the form of a map of the inhomogeneities. Applying the map to the simulation when generating the transfer matrix will yield a matrix that compensates for the inhomogeneity.

Part IX

An example of the present subject matter can address selected regions of resonance independently during excitation. One example can provide one or more dimensions of frequency or phase encoding as well as advantages over other entirely spatially encoded sequences that lack localization in their excitation scheme. The degree of freedom provided by spatially localized excitation allows one example of the present subject matter to be particularly suited to compensate for multi-dimensional field non-uniformities.

The inverse problem solution is well suited for reconstruction of entirely spatially encoded data. This method of reconstruction is well suited for building a library of transfer functions which then can be applied to data sets generated with the same parameters. With such a library, inverse problem reconstruction is comparable to, or only slightly longer than, Fourier reconstruction.

In Fourier imaging, spatial resolution is determined by the acquisition parameters, whereas the resolution in spatiotemporal imaging is determined mainly by the excitation scheme. Consequently, maintaining reasonable excitation times and amplitudes can limit the achievable pixel size for time encoding. However, a super-resolution reconstruction technique can provide the ability to recover this resolution in hybrid sequences. The super-resolution reconstruction can be viewed as a one-dimensional inverse problem solution applied along the spatiotemporal encoding direction. This technique, when expanded to two dimensions, is equivalent to increasing the number of pixels along the x and y coordinates of the simulation used to generate the transfer function. Expansion to two spatial dimensions can produce a matrix, and the matrix can be inverted computationally or by a combination of iterative inversion methods and tailored computing systems. Entirely spatiotemporal sequences with grid-like excitation may benefit from the implementation of inverse problem methods. Like an example of the present subject matter, such methods can entail combining x and y axes into one dimension of the transfer matrix, with spatiotemporal encoding along the other dimension.

Part X—Gapped Excitation

In addition to the GRE and SE versions of the present subject matter described herein, one example can be implemented with gapped or simultaneous acquisition. Timewise gaps can be introduced to the RF pulse allowing signal to be acquired in those gaps for nearly simultaneously transmit and receive in the spatial domain, or signal can be acquired during the RF pulse for truly simultaneous transmit and receive.

Figure 10C:
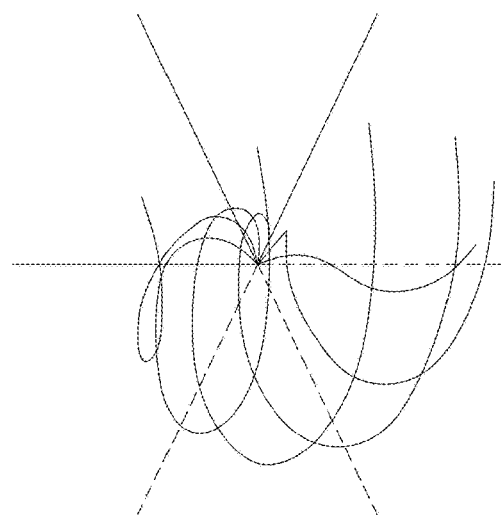
FIGS. 10A, 10B, and 10C illustrate trajectories, according to various examples.
Figure 10B:
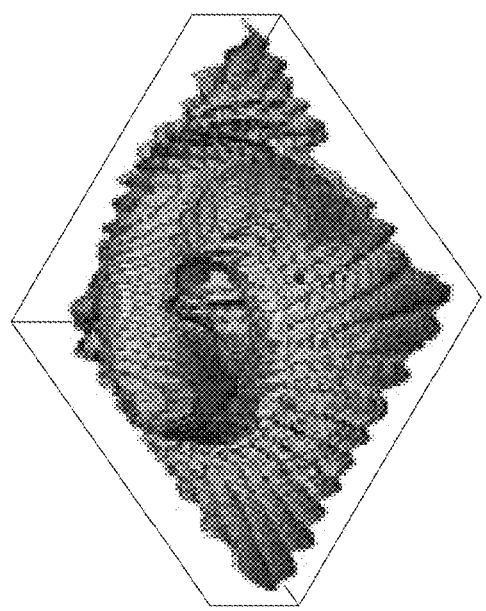
Figure 10A:
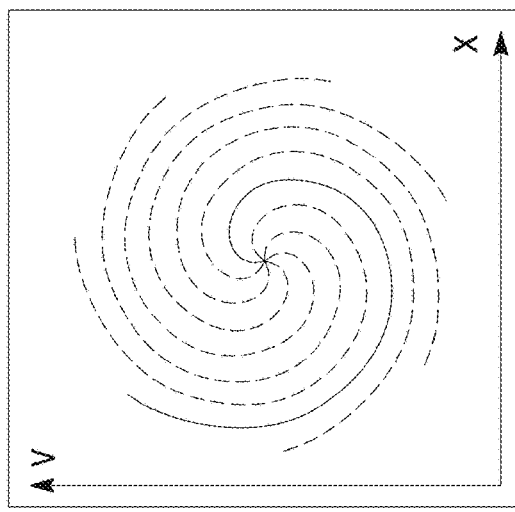

FIGS. 10A, 10B, and 10C illustrate examples of spatial trajectories (not k-space). The figures illustrate that 2D or 3D space can be covered without frequency or phase encoding, and thus, allowing image reconstruction without Fourier transform. FIG. 10A illustrates rotation of trajectories to fill two dimensional space.

FIG. 10B illustrates inverse magnitude of the z-axis magnetization from simulated excitation, according to one example of the present subject matter. FIG. 10C illustrates an example of trajectories implemented as a 3D sequence. In FIG. 10C, three dimensional paths through space are created by applying a sinusoidal gradient along the z-axis in addition to the sinusoidal gradients along the x-axis and the y-axis. Repetition of the trajectory with different initial angles or phases of the gradients can be used to sufficiently cover a two-dimensional area or three-dimensional space.

Figure 11:
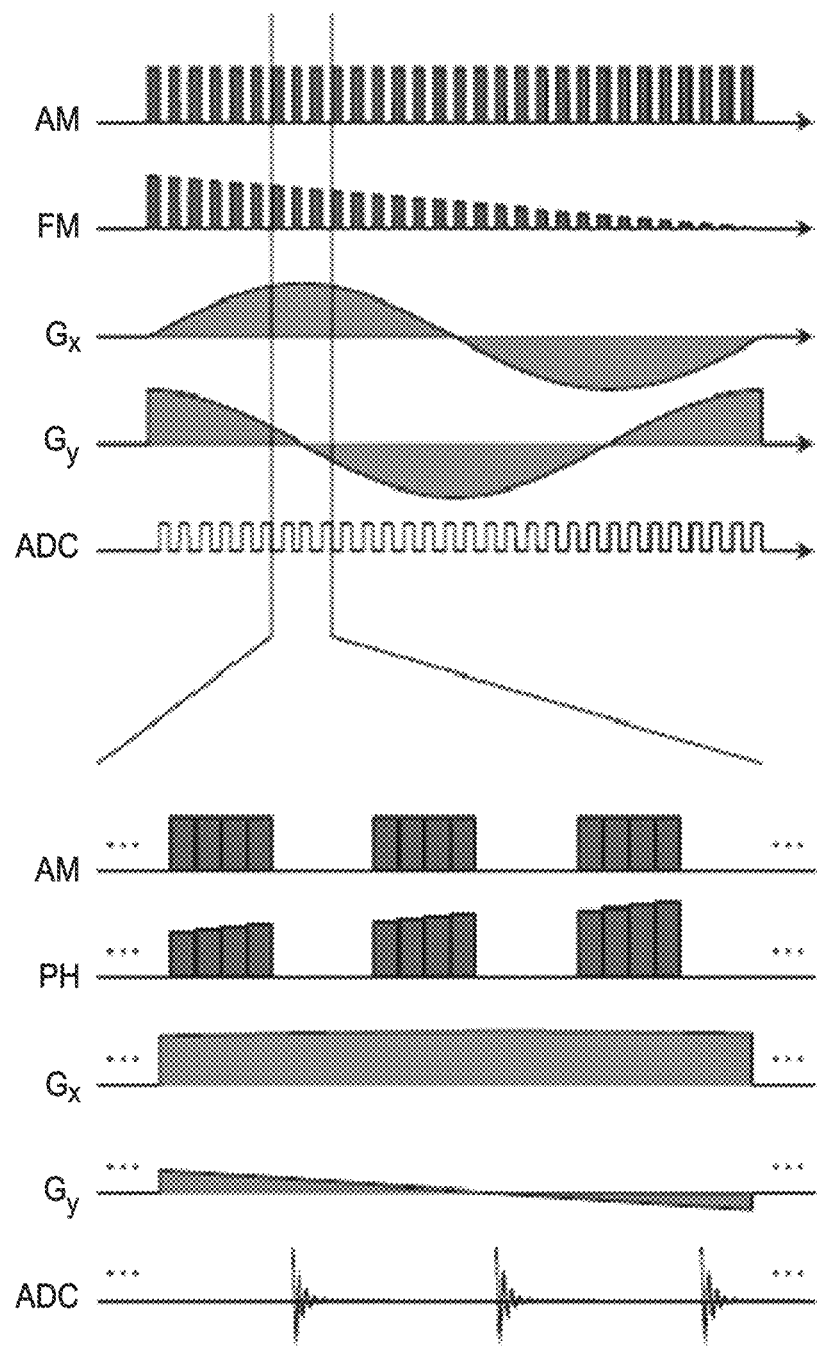
FIG. 11 illustrates a pulse sequence associated with gapped excitation, according to one example.

FIG. 11 illustrates an example of implementation using a gapped acquisition method. An excitation pattern similar to the other implementations can be used along with gaps in the RF pulse during which time, the signal may be acquired for nearly simultaneous transmit and receive. One example can be implemented without resort to a swept frequency and instead, the gradient amplitude can be modulated during excitation.

FIG. 11 illustrates an example of gapped excitation and acquisition with the lower five timelines representing a magnified view of the upper five timelines. The magnified segments illustrate the gapping pattern. The proportion of time during which the RF pulse is turned on is called the duty cycle (dc). If the excitation and acquisition were truly simultaneous (rather than alternating) the duty cycle would be 1. A duty cycle of 0.25 provides a reasonably sufficient time between excitation and acquisition for coil ring-down.

Figure 12:
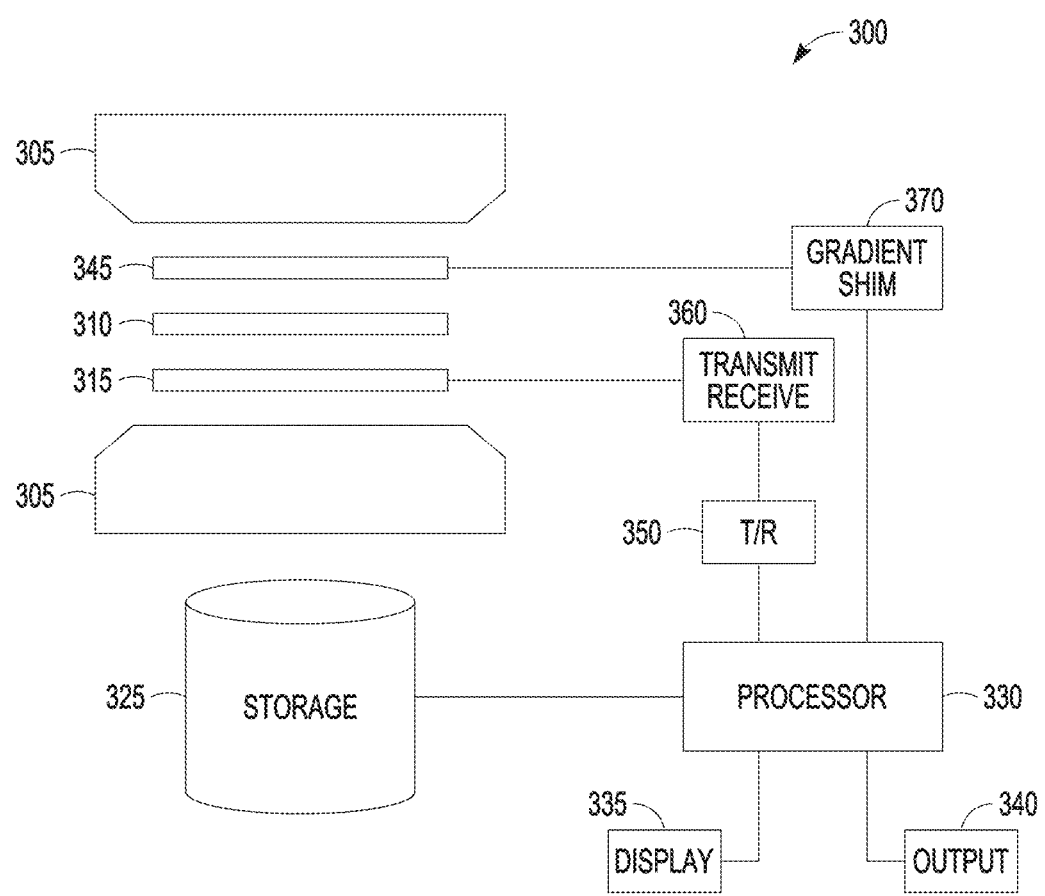
FIG. 12 illustrates a block diagram of a magnetic resonance system according to one example.

FIG. 12 includes a block diagram of imaging system 300. Imaging system 300, in this example, depicts a magnetic resonance system and includes magnet 305. Coil 315 and object 310 are positioned within the field of magnet 305. Object 310 can include a human body, an animal, a phantom, or other specimen. Coil 315, sometimes referred to as an antenna, can include a transmit coil, a receive coil, or both a transmitter and receiver coil. In various examples, module 360 includes a front end coupled to a transmit coil and an amplifier coupled to a receiver coil. Module 360 is coupled to processor 330 by T/R switch 350.

Gradient/shim coil 345 is proximate object 310 and is coupled to module 370. Module 370 provides control and power signals to coil 345 to apply a gradient and to apply a shim field.

As a receive coil, coil 315 provides a signal to receiving unit 320. Receiving unit 320 can include an analog-to-digital converter (ADC), a pre-amplifier, a filter, or other module to prepare the received signal for processing. Receiving unit 320 is coupled to processor 330. In one example, system 300 includes a transmit unit and a transmit coil configured to provide excitation to object 310.

Processor 330 can include a digital signal processor, a microprocessor, a controller, or other module to perform an operation on the signal from the receiving unit. Processor 330 is also coupled to storage 325, display 335 and output unit 340.

Storage 325 can include a memory for storing data. The data can include image data as well as results of processing performed by processor 330. In one example, storage 325 provides storage for executable instructions for use by processor 330. The instructions can be configured to implement a particular algorithm.

Display 335 can include a screen, a monitor, or other device to render a visible image corresponding to object 310. For example, display 335 can be configured to display a radial projection, a Cartesian coordinate projection, or other view corresponding to object 310. Output unit 340 can include a printer, a storage device, a network interface or other device configured to receive processed data.

Processor 330 is configured to execute an algorithm to control T/R switch 350, module 360, coil 315, module 370, and coil 345 in order to implement a method as described herein.

Figure 13:
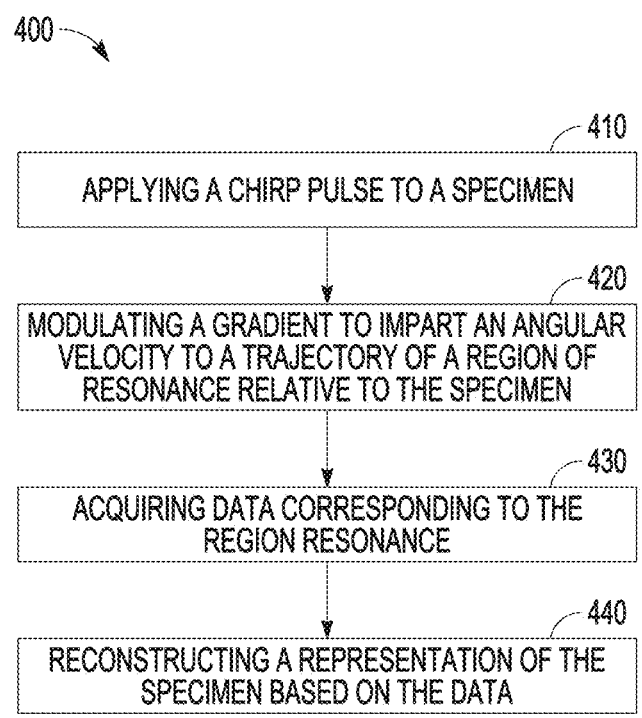
FIG. 13 illustrates a method according to one example.

FIG. 13 illustrates method 400 for generating a magnetic resonance image. Method 400, at 410, includes applying a chirp pulse to a specimen. Method 400, at 420, includes modulating a gradient to impart an angular velocity to a trajectory of a region of resonance relative to the specimen. Method 400, at 430, includes acquiring data corresponding to the region of resonance and, at 440, reconstructing a representation of the specimen based on the data.

A chirp pulse is but one example of a pulse suitable for use with the present subject matter. Other pulse forms, including a frequency modulated pulse or a frequency swept pulse can also be used.

Parallel imaging entails using multiple receiver coils to accelerate data collection and reduce acquisition times. Various parallel reconstruction algorithms are available, including SENSE, SMASH, g-SMASH and GRAPPA. One or more regions of resonance can be selectively steered using various examples of the present subject matter. Multiple simultaneous regions of resonance can be employed without parallel imaging but may be particularly beneficial when used in combination with parallel imaging. Such implementations of parallel imaging can be beneficial for angiography, cardiac imaging, dynamic contrast enhancement, and other applications that benefit from high temporal resolution.

In one example, the present subject matter can be applied to parallel imaging. For example, the inverse problem can be addressed by controlling multiple steerable resonance regions using a multiband pulse. In addition, multiple receiver channels can be used to acquire image data.

In one example, multiple separate transmit channels are used. Each channel can be configured to present unique pulses or unique frequency offsets that produce discrete regions of resonance that can be steered as described herein. In one example, the magnitude of each channel is independently controlled or manipulated. The inverse problem approach, such as described in this document, can be used to generate an image.

The trajectory of the steerable resonance region can be in the form of a spiral. The trajectory can also include a series of concentric circles as well as a series of rotated and offset circles. Numerous other trajectories are also contemplated. In addition, the resonance region can be configured to remain in a stationary position in the form of an excitation point. Targets suitable for imaging using various examples of the present subject matter can include teeth, spleen, and intestines. For example, an excitation trajectory such as that shown in FIG. 10C can be used to generate an image of a jaw line.

In one example, the trajectory can be described as a spiral. Image reconstruction can include calculating a pseudoinverse.

In one example, the present subject matter is configured to compensate for wide variations in magnetic field in a MR scanner system. A highly homogeneous magnet in a MR scanner system is very costly. An example of the present subject matter can be configured to generate good quality images using a low quality—and low cost—magnet system. The technology described herein can be applied to compensate for $B_0$ and $B_1$ variations.

Part XI—Inverse Problem Solution

One example of the present subject matter entails using an inverse problem reconstruction for MR data. Geometric reconstruction along the spatiotemporal encoding dimension is generally used in only one dimension. Super-resolution, as used with previous spatiotemporal encoding methods, entails processing to improve image resolution in one dimension, and in order to form an image, the Fourier transform is used for at least one dimension.

For an example of the present subject matter in 2D form, one dimension is slice selected and the remaining dimensions are spatiotemporally encoded. Using the geometric method employed for the 1D spatiotemporal method is inadequate, resulting in more complex problems than increased pixel size.

Expanding to two dimension of spatiotemporal encoding by introducing rotating gradients allows focusing of the signal both with a frequency sweep and with the rotational velocity. The profile along the radial dimension of the region of resonance is generated primarily by a frequency sweep. The tangential profile of the region of resonance is generated primarily by the gradient-induced rotational velocity. The combination of these contributions can determine the excitation profile, as demonstrated with simulations. However, a plot of the z-axis magnetization after excitation inherently hides the rotational contribution to the profile. Additionally, the rotational isolation can be used to generate an image without using a RF frequency sweep.

The rotational velocity contributes to the profile of the region of resonance. Geometric reconstruction is inadequate for use with more than one dimension of spatiotemporal encoding. Accordingly, one example of the present subject matter includes reconstruction of an MR image using only the inverse problem method.

It is to be understood that in general, magnetic resonance typically entails application of two magnetic fields—one commonly referred to as $B_0$ and another commonly referred to as the gradients. Typically, $B_0$ remains static and the gradients are changed in space and time however, the reverse configuration can also be used (that is, $B_0$ can be changed and the gradients can remain static). In one example, a spatially varying magnetic field is a gradient.

Various Notes & Examples

Example 1 can include a method for generating a magnetic resonance image. The method can include applying a radio frequency (RF) pulse to a specimen, modulating a spatially varying magnetic field to move an isolated region of resonance along a rotational trajectory relative to the specimen, acquiring data corresponding to the at least one region of resonance, and reconstructing a representation of the specimen based on the data.

Example 2 can include, or can optionally be combined with the subject matter of Example 1 to optionally include wherein reconstructing the representation of the specimen includes accessing data corresponding to experimental parameters.

Example 3 can include, or can optionally be combined with the subject matter of one or any combination of Examples 1 or 2 to optionally include wherein reconstructing the representation of the specimen includes accessing data corresponding to time and position.

Example 4 can include, or can optionally be combined with the subject matter of one or any combination of Examples 1 through Example 3 wherein reconstructing the representation of the specimen includes using a transfer function.

Example 5 can include, or can optionally be combined with the subject matter of one or any combination of Examples 1 through Example 4 wherein applying the radio frequency pulse includes applying a gapped pulse.

Example 6 can include, or can optionally be combined with the subject matter of one or any combination of Examples 1 through Example 5 wherein applying the radio frequency pulse occurs simultaneously with acquiring data.

Example 7 can include, or can optionally be combined with the subject matter of one or any combination of Examples 1 through Example 6 wherein applying the radio frequency pulse includes applying a pulse using multiple transmit channels.

Example 8 can include, or can optionally be combined with the subject matter of one or any combination of Examples 1 through Example 7 wherein applying the pulse using multiple transmit channels includes applying a plurality of magnitude and phase values.

Example 9 can include, or can optionally be combined with the subject matter of one or any combination of Examples 1 through Example 8 wherein acquiring data includes acquiring data corresponding to a plurality of trajectories.

Example 10 can include, or can optionally be combined with the subject matter of one or any combination of Examples 1 through Example 9 and further including modulating a parameter to spatially alter the trajectory.

Example 11 can include, or can optionally be combined with the subject matter of one or any combination of Examples 1 through Example 10 and further including modulating a parameter to temporally alter the trajectory.

Example 12 can include, or can optionally be combined with the subject matter of one or any combination of Examples 1 through Example 11 and further including modulating a second magnetic field.

Example 13 can include, or can optionally be combined with the subject matter of one or any combination of Examples 1 through Example 12 and further including modulating the radio frequency pulse.

Example 14 can include, or can optionally be combined with the subject matter of one or any combination of Examples 1 through Example 13 wherein reconstructing includes solving an inverse problem.

Example 15 can include, or can optionally be combined with the subject matter of one or any combination of Examples 1 through Example 14 wherein applying the radio frequency pulse includes applying a multiband pulse.

Example 16 can include, or can optionally be combined with the subject matter of one or any combination of Examples 1 through Example 15 wherein acquiring data includes acquiring using multiple receiver channels.

Example 17 can include, or can optionally be combined with the subject matter of one or any combination of Examples 1 through Example 16 wherein modulating the spatially varying magnetic field entails controlling the trajectory to have an angular velocity.

Example 18 can include a method for generating a magnetic resonance image, the method including applying a radio frequency (RF) pulse to a specimen, selecting a spatially varying magnetic field to position an isolated region of resonance along a rotational trajectory relative to the specimen, acquiring data corresponding to the region of resonance, and reconstructing a representation of the specimen based on the data.

Example 19 can include a method of generating a magnetic resonance image, the method including selecting a rotational pathway relative to a specimen, applying a radio frequency (RF) pulse to the specimen, modulating a spatially varying magnetic field to move an isolated region of resonance along the rotational pathway, acquiring data corresponding to the region of resonance, and reconstructing a representation of the specimen based on the data.

Example 20 can include, or can optionally be combined with the subject matter of Examples 19, and further including modulating excitation to the specimen.

Example 21 can include, or can optionally be combined with the subject matter of one or any combination of Examples 19 or 20 and optionally including wherein acquiring data includes using a plurality of receiver coils to acquire data using a parallel imaging algorithm.

Example 22 can include, or can optionally be combined with the subject matter of one or any combination of Examples 19 through Example 21 wherein acquiring data includes calculating an inverse or pseudoinverse of a magnetic transfer function.

Example 23 can include, or can optionally be combined with the subject matter of one or any combination of Examples 19 through Example 22 and further including compensating for $B_0$ magnetic field inhomogeneity by adjusting at least one of RF amplitude, frequency, and a spatially varying magnetic field.

Example 24 can include, or can optionally be combined with the subject matter of one or any combination of Examples 19 through Example 23 and further including compensating for $B_1$ magnetic field inhomogeneity by adjusting at least one of RF amplitude, frequency, and a spatially varying magnetic field.

Example 25 can include a method of generating a magnetic resonance image, the method including identifying a rotational pathway relative to a specimen, applying a radio frequency (RF) pulse to the specimen, selecting a spatially varying magnetic field to position an isolated region of resonance along the pathway, acquiring data corresponding to the region of resonance, and reconstructing a representation of the specimen based on the data.

Example 26 can include a system having a magnet, a spatially varying magnetic field generator, a pulse generator, and a processor. The magnet can be configured to generate a magnetic field. The spatially varying magnetic field generator can be configured to impose a controllable gradation within the magnetic field. The pulse generator can be configured to provide radio frequency excitation to a region of interest within the magnetic field, the excitation configured to enable calculation of a magnetic resonance image. The processor can be coupled to the spatially varying magnetic field generator and the pulse generator. The processor can be configured to generate an isolated region of resonance within the region of interest, the processor can be configured to control the spatially varying magnetic field generator and control the pulse generator to cause the region of resonance to move along a rotary trajectory.

Example 27 can include, or can optionally be combined with the subject matter of Example 26 and optionally wherein the processor is configured to manipulate a $B_0$ field within the magnet.

Example 28 can include, or can optionally be combined with the subject matter of one or any combination of Examples 26 or Example 27 and optionally wherein the processor is configured to manipulate a $B_1$ field within the magnet.

Example 29 can include, or can optionally be combined with the subject matter of one or any combination of Examples 26 through Example 28 and optionally wherein the region of resonance includes a stationary point.

Example 30 can include, or can optionally be combined with the subject matter of one or any combination of Examples 26 through Example 29 and optionally wherein the region of resonance includes a point traversing the region of interest.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A method for generating a magnetic resonance image, the method including:
   applying a radio frequency (RF) pulse to a specimen;
   modulating a spatially varying magnetic field to move an isolated region of resonance along a rotational trajectory relative to the specimen;
   acquiring data corresponding to the at least one region of resonance, wherein the data are spatiotemporally encoded data that are encoded with spatial coordinates in a spatial domain in a temporally dependent manner; and
   reconstructing a representation of the specimen based on the spatiotemporally encoded data.

2. The method of claim 1 wherein reconstructing the representation of the specimen includes accessing data corresponding to experimental parameters.

3. The method of claim 1 wherein reconstructing the representation of the specimen includes accessing data corresponding to time and position.

4. The method of claim 1 wherein reconstructing the representation of the specimen includes using a transfer function.

5. The method of claim 1 wherein applying the radio frequency pulse includes applying a gapped pulse.

6. The method of claim 1 wherein applying the radio frequency pulse occurs simultaneously with acquiring data.

7. The method of claim 1 wherein applying the radio frequency pulse includes applying a pulse using multiple transmit channels.

8. The method of claim 7 wherein applying the pulse using multiple transmit channels includes applying a plurality of magnitude and phase values.

9. The method of claim 1 wherein acquiring data includes acquiring data corresponding to a plurality of trajectories.

10. The method of claim 1 further including modulating a parameter to spatially alter the trajectory.

11. The method of claim 1 further including modulating a parameter to temporally alter the trajectory.

12. The method of claim 1 further including modulating a second magnetic field.

13. The method of claim 1 further including modulating the radio frequency pulse.

14. The method of claim 1 wherein reconstructing includes solving an inverse problem.

15. The method of claim 1 wherein applying the radio frequency pulse includes applying a multiband pulse.

16. The method of claim 1 wherein acquiring data includes acquiring using multiple receiver channels.

17. The method of claim 1 wherein modulating the spatially varying magnetic field entails controlling the trajectory to have an angular velocity.

18. A method for generating a magnetic resonance image, the method including:
   applying a radio frequency (RF) pulse to a specimen;
   selecting a spatially varying magnetic field to position an isolated region of resonance along a rotational trajectory relative to the specimen;
   acquiring data corresponding to the region of resonance, wherein the data are spatiotemporally encoded data that are encoded with spatial coordinates in a spatial domain in a temporally dependent manner; and
   reconstructing a representation of the specimen based on the spatiotemporally encoded data.

19. A method of generating a magnetic resonance image, the method comprising:
   selecting a rotational pathway relative to a specimen;
   applying a radio frequency (RF) pulse to the specimen;
   modulating a spatially varying magnetic field to move an isolated region of resonance along the rotational pathway;
   acquiring data corresponding to the region of resonance, wherein the data are spatiotemporally encoded data that are encoded with spatial coordinates in a spatial domain in a temporally dependent manner; and
   reconstructing a representation of the specimen based on the spatiotemporally encoded data.

20. The method of claim 19 further including modulating excitation to the specimen.

21. The method of claim 19 wherein acquiring data includes using a plurality of receiver coils to acquire data using a parallel imaging algorithm.

22. The method of claim 19 wherein acquiring data includes calculating a pseudoinverse of a magnetic transfer function.

23. The method of claim 19 further including compensating for B0 magnetic field inhomogeneity by adjusting at least one of RF amplitude, frequency, and a spatially varying magnetic field.

24. The method of claim 19 further including compensating for B1 magnetic field inhomogeneity by adjusting at least one of RF amplitude, frequency, and a spatially varying magnetic field.

25. A method of generating a magnetic resonance image, the method comprising:
   identifying a rotational pathway relative to a specimen;
   applying a radio frequency (RF) pulse to the specimen;
   selecting a spatially varying magnetic field to position an isolated region of resonance along the pathway;
   acquiring data corresponding to the region of resonance, wherein the data are spatiotemporally encoded data that are encoded with spatial coordinates in a spatial domain in a temporally dependent manner; and reconstructing a representation of the specimen based on the spatiotemporally encoded data.

26. A system comprising:
a magnet configured to generate a magnetic field;
a spatially varying magnetic field generator configured to impose a controllable gradation within the magnetic field;
a pulse generator configured to provide radio frequency excitation to a region of interest within the magnetic field, the excitation configured to enable calculation of a magnetic resonance image;
a processor coupled to the spatially varying magnetic field generator and the pulse generator, the processor configured to generate an isolated region of resonance within the region of interest, the processor configured to control the spatially varying magnetic field generator and control the pulse generator to cause the region of resonance to move along a rotary trajectory; and
wherein the processor is configured to acquire spatiotemporally encoded data from the isolated region of resonance and to reconstruct an image from the spatiotemporally encoded data, wherein the spatiotemporally encoded data are encoded with spatial coordinates in a spatial domain in a temporally dependent manner.

27. The system of claim 26 wherein the processor is configured to manipulate a B0 field within the magnet.

28. The system of claim 26 wherein the processor is configured to manipulate a B1 field within the magnet.

29. The system of claim 26 wherein the region of resonance includes a stationary point.

30. The system of claim 26 wherein the region of resonance includes a point traversing the region of interest.

* * * * *

UNITED STATES PATENT AND TRADEMARK OFFICE
CERTIFICATE OF CORRECTION

PATENT NO. : 10,564,241 B2
APPLICATION NO. : 13/743902
DATED : February 18, 2020
INVENTOR(S) : Angela Lynn Styczynski Snyder et al.

It is certified that error appears in the above-identified patent and that said Letters Patent is hereby corrected as shown below:

In the Specification

Column 7, Line 57, "resonance, having" should be --resonance, $M_{xy}$ having--.

Column 7, Line 65, "to r will" should be --to $\vec{r}$ will--.

Signed and Sealed this
Seventh Day of April, 2020

Andrei Iancu
*Director of the United States Patent and Trademark Office*